US010474299B2

(12) United States Patent
Kim et al.

(10) Patent No.: US 10,474,299 B2
(45) Date of Patent: Nov. 12, 2019

(54) TOUCH WINDOW AND DISPLAY WITH THE SAME

(71) Applicant: LG INNOTEK CO., LTD., Seoul (KR)

(72) Inventors: Hyun Soo Kim, Seoul (KR); In Seok Kang, Seoul (KR); June Roh, Seoul (KR); Dong Mug Seong, Seoul (KR); Jun Phill Eom, Seoul (KR); Jun Lee, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 268 days.

(21) Appl. No.: 15/121,132

(22) PCT Filed: Feb. 10, 2015

(86) PCT No.: PCT/KR2015/001354
§ 371 (c)(1),
(2) Date: Aug. 24, 2016

(87) PCT Pub. No.: WO2015/126088
PCT Pub. Date: Aug. 27, 2015

(65) Prior Publication Data
US 2017/0010710 A1    Jan. 12, 2017

(30) Foreign Application Priority Data

Feb. 24, 2014  (KR) .................. 10-2014-0021238
Feb. 27, 2014  (KR) .................. 10-2014-0023643
Mar. 4, 2014   (KR) .................. 10-2014-0025723

(51) Int. Cl.
| | |
|---|---|
| *B32B 3/00* | (2006.01) |
| *B41M 5/00* | (2006.01) |
| *B32B 5/00* | (2006.01) |
| *G06F 3/044* | (2006.01) |
| *C09D 175/14* | (2006.01) |
| *C09D 175/04* | (2006.01) |
| *G06F 3/041* | (2006.01) |
| *G02F 1/1333* | (2006.01) |
| *G02F 1/1362* | (2006.01) |
| *G02F 1/1368* | (2006.01) |
| *H01L 27/32* | (2006.01) |

(52) U.S. Cl.
CPC ........... *G06F 3/044* (2013.01); *C09D 175/04* (2013.01); *C09D 175/14* (2013.01); *G06F 3/0412* (2013.01); *G02F 1/1368* (2013.01); *G02F 1/13338* (2013.01); *G02F 1/136209* (2013.01); *G02F 2001/136222* (2013.01); *G06F 2203/04102* (2013.01); *G06F 2203/04103* (2013.01); *G06F 2203/04111* (2013.01); *G06F 2203/04112* (2013.01); *H01L 27/323* (2013.01); *H01L 27/3244* (2013.01)

(58) Field of Classification Search
CPC ........... G06F 3/044; G06F 2203/04102; G06F 2203/04112; G06F 2203/04103; C09D 175/04; G02F 1/1368
USPC ........................................ 428/201, 195.1, 98
See application file for complete search history.

(56) References Cited

U.S. PATENT DOCUMENTS

| | | | |
|---|---|---|---|
| 7,569,269 B2 | 8/2009 | Takada et al. | |
| 2007/0178297 A1* | 8/2007 | Takada ................. | C08G 18/673 428/323 |
| 2013/0141785 A1 | 6/2013 | Lee et al. | |
| 2013/0258570 A1 | 10/2013 | Nashiki et al. | |
| 2013/0293096 A1 | 11/2013 | Kang et al. | |
| 2013/0328575 A1* | 12/2013 | Ra ........................ | G06F 3/041 324/649 |
| 2013/0344299 A1 | 12/2013 | Sharygin et al. | |
| 2014/0028584 A1 | 1/2014 | Park et al. | |

FOREIGN PATENT DOCUMENTS

| | | |
|---|---|---|
| CN | 1906235 | 1/2007 |
| CN | 102999219 | 3/2013 |
| KR | 10-0815383 | 3/2008 |
| KR | 10-2013-0062180 | 6/2013 |
| KR | 10-2013-0073353 | 7/2013 |
| KR | 1030130073353 | * 7/2013 |
| KR | 10-2013-0100355 | 10/2013 |
| KR | 10-1322333 | 10/2013 |
| KR | 10-2013-0124882 | 11/2013 |

OTHER PUBLICATIONS

Eom et al, KR 1020130073353 Machine Translation, Jul. 3, 2013 (Year: 2013).*
Chinese Office Action dated Jun. 21, 2018 issued in Application No. 201580010311.9 (with English translation).
International Search Report and Written Opinion dated May 19, 2015 issued in Application No. PCT/KR2015/001354.

* cited by examiner

*Primary Examiner* — Jessica Whiteley
(74) *Attorney, Agent, or Firm* — Ked & Associates, LLP

(57) ABSTRACT

Disclosed is a touch window including a substrate, and an electrode layer on the substrate. A retardation difference is 0.2% or less depending on an incident angle of light in the substrate.

18 Claims, 10 Drawing Sheets

[Fig. 1]
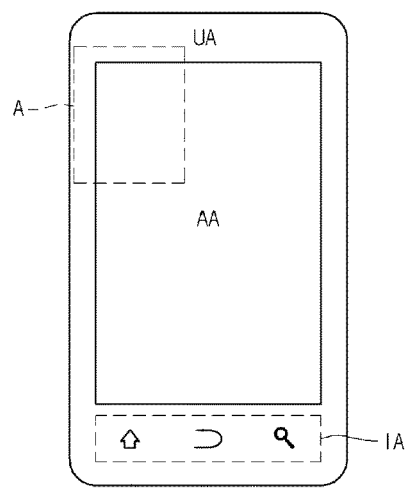
[Fig. 2]
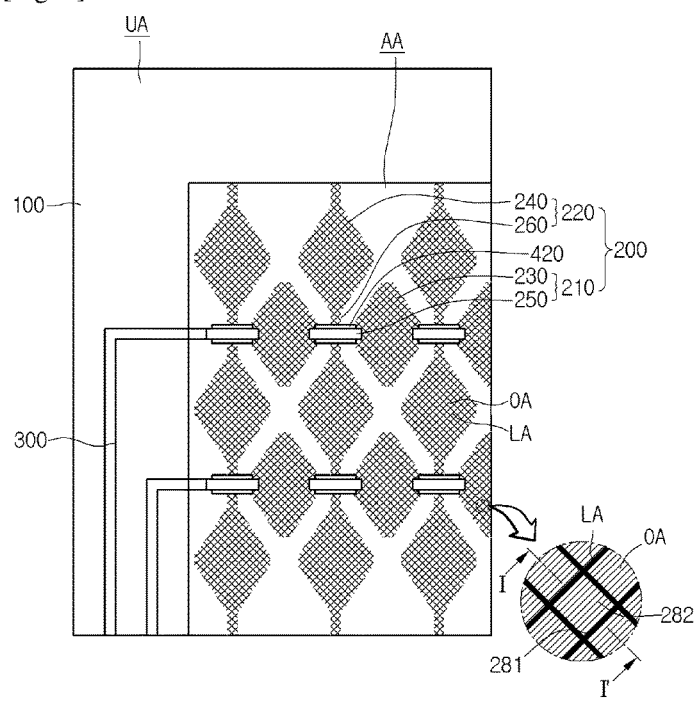
[Fig. 3]
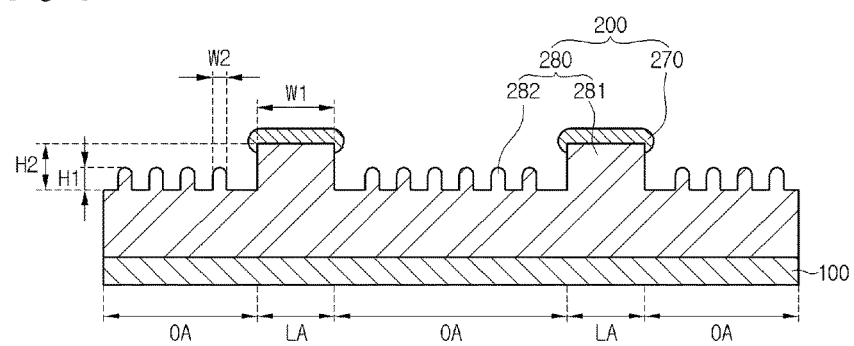

[Fig. 4]
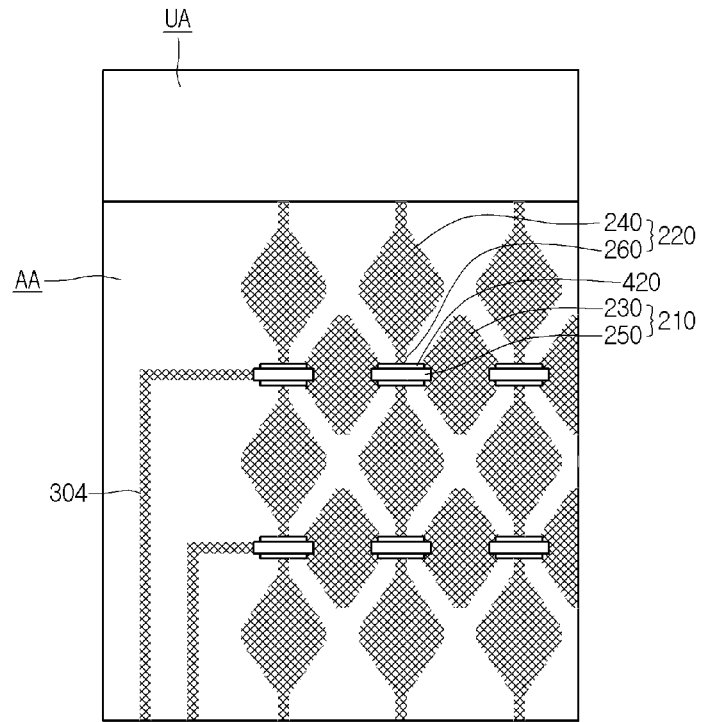
[Fig. 5]
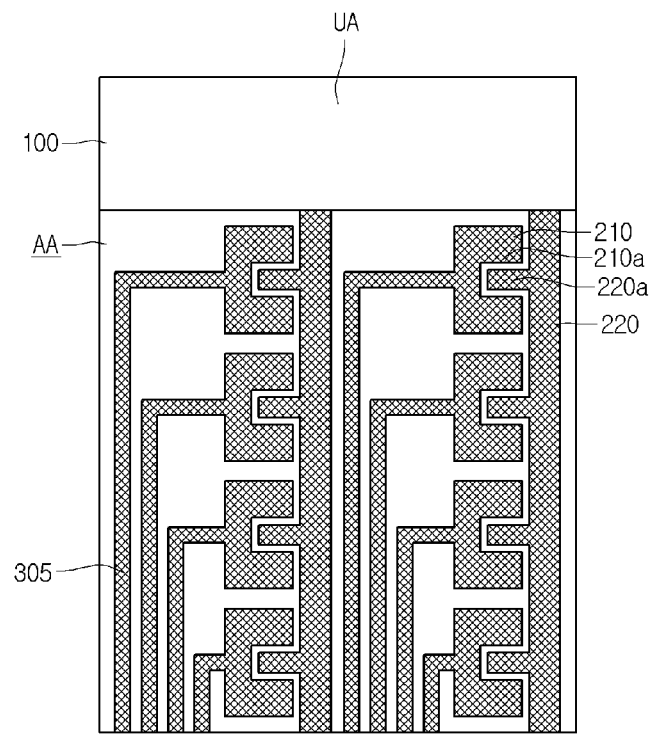

[Fig. 6]
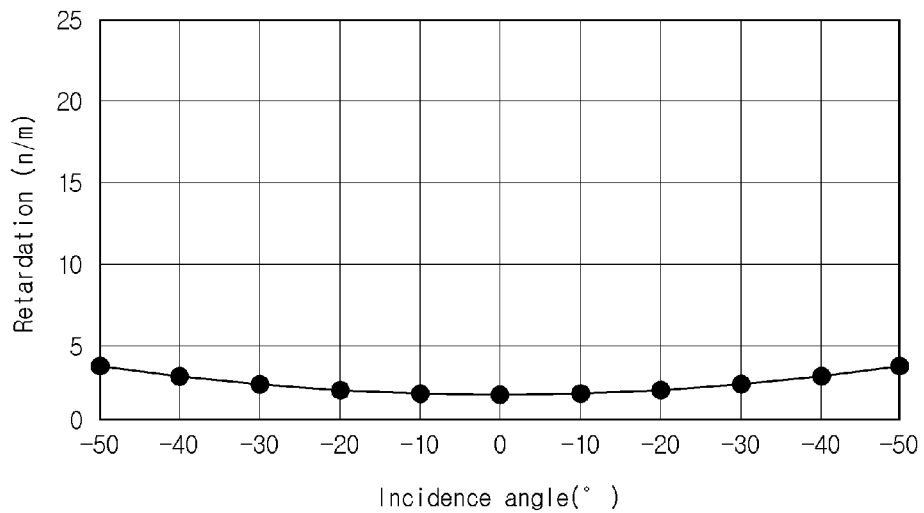
[Fig. 7]
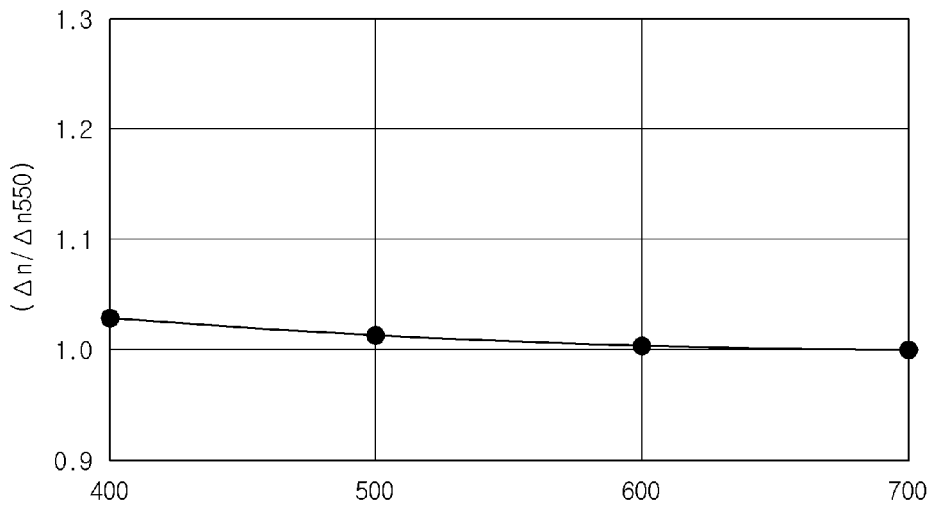
[Fig. 8]
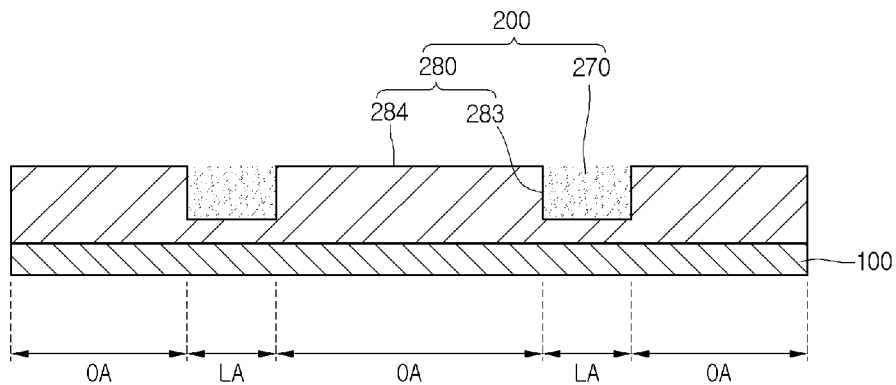

[Fig. 9]
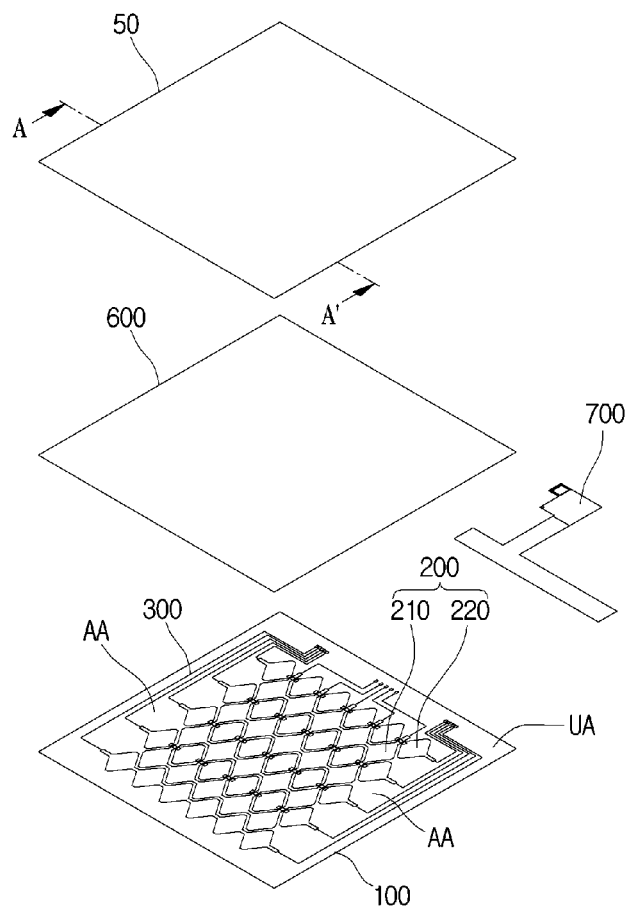
[Fig. 10]
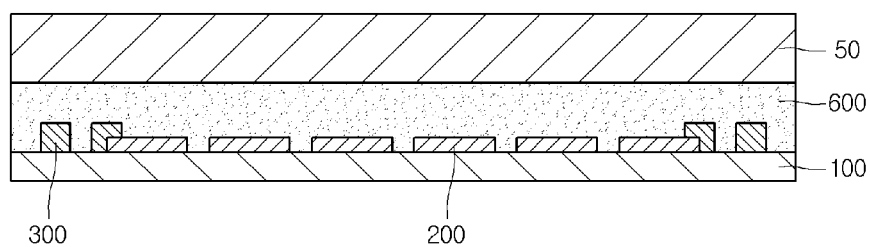

[Fig. 11]
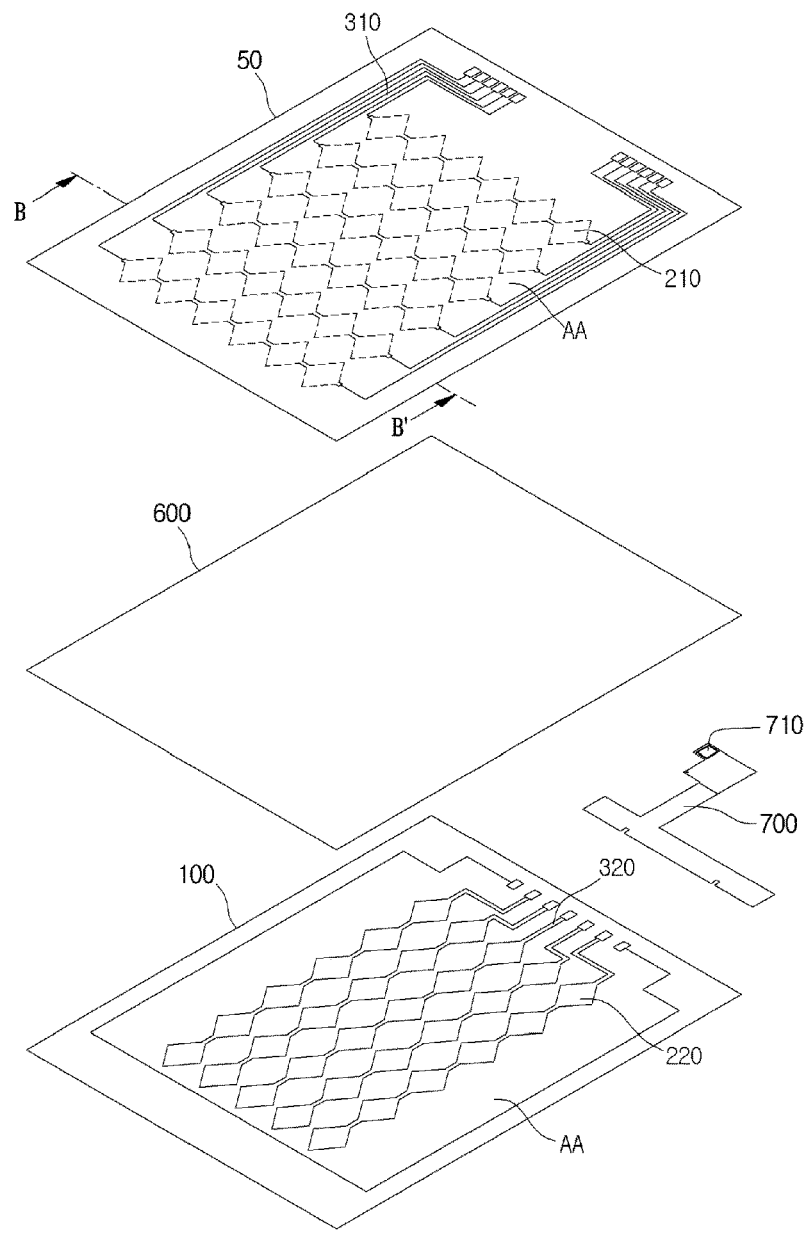
[Fig. 12]
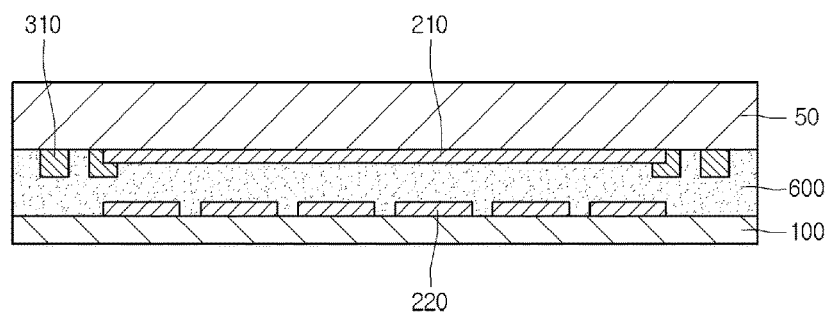

[Fig. 13]
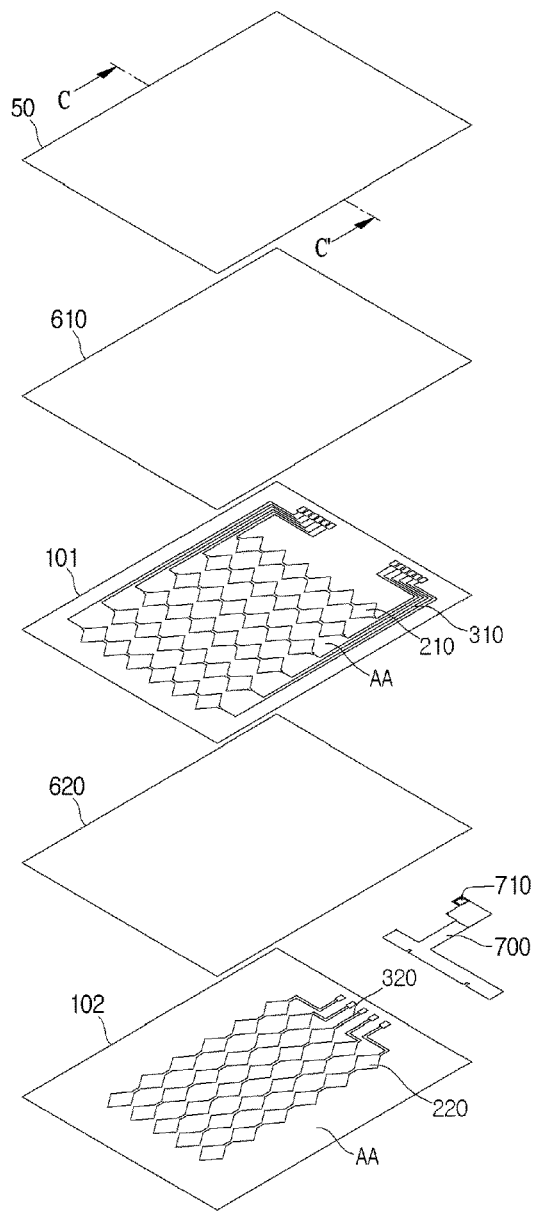
[Fig. 14]
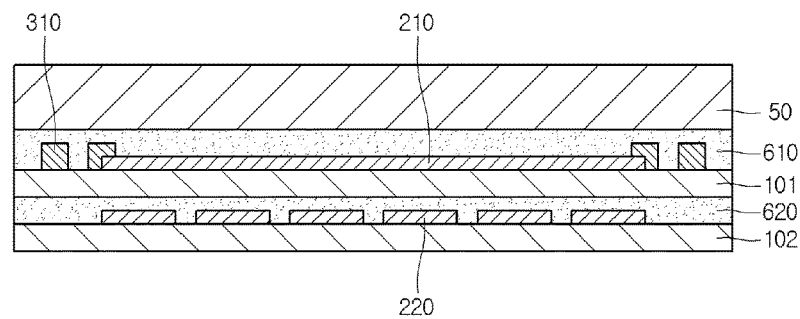

[Fig. 15]
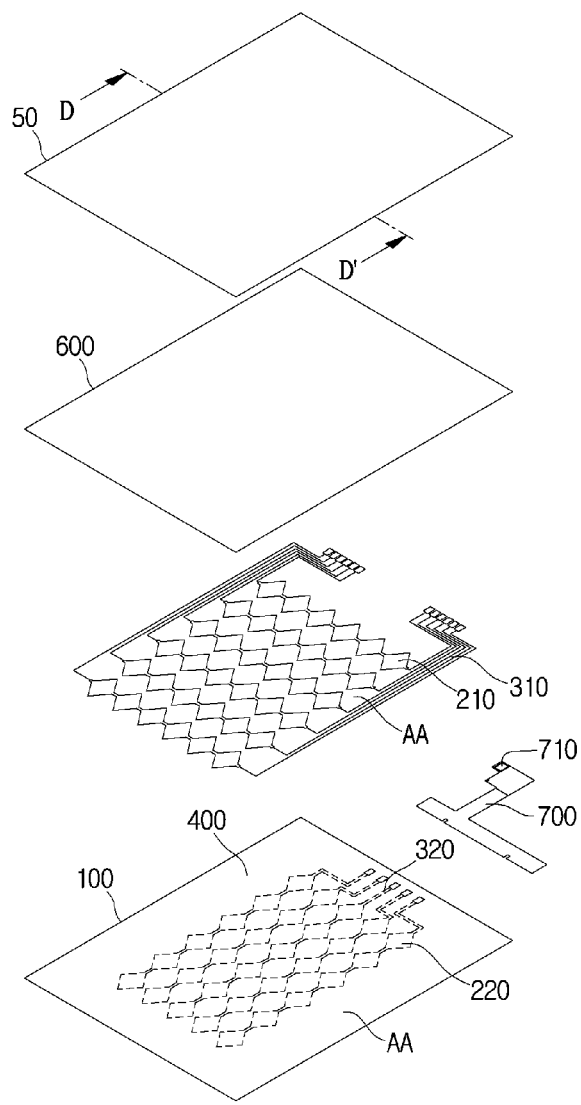
[Fig. 16]
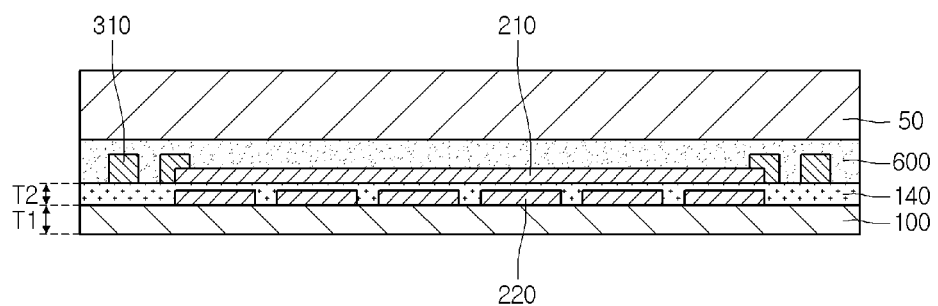

[Fig. 17]
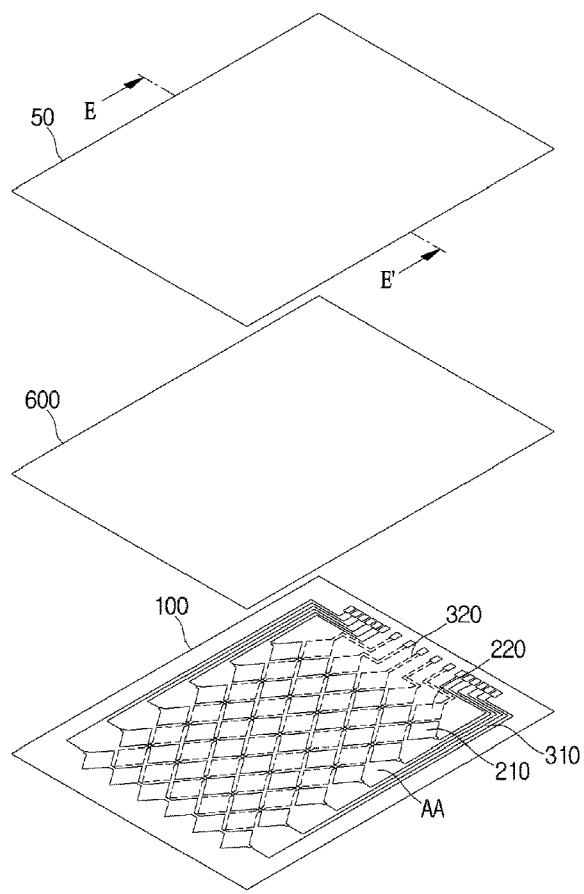
[Fig. 18]
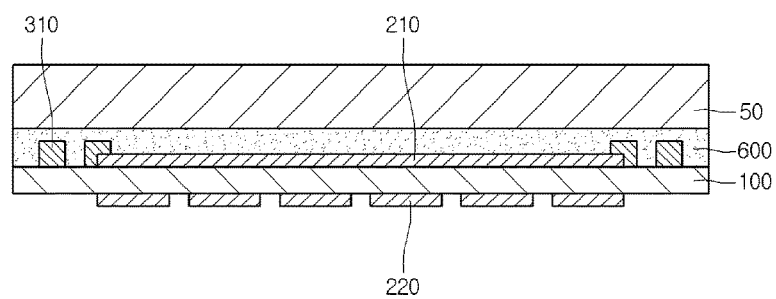
[Fig. 19]
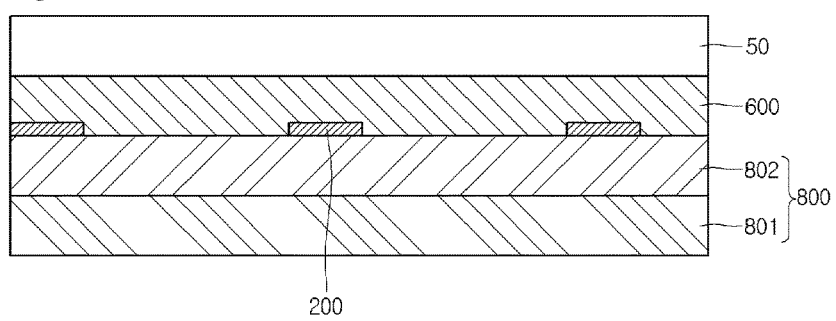

[Fig. 20]
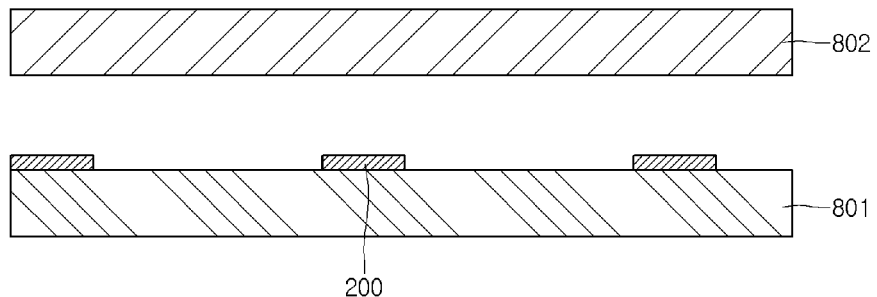
[Fig. 21]
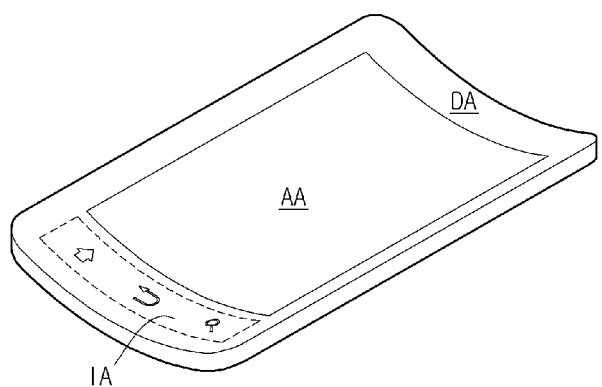
[Fig. 22]
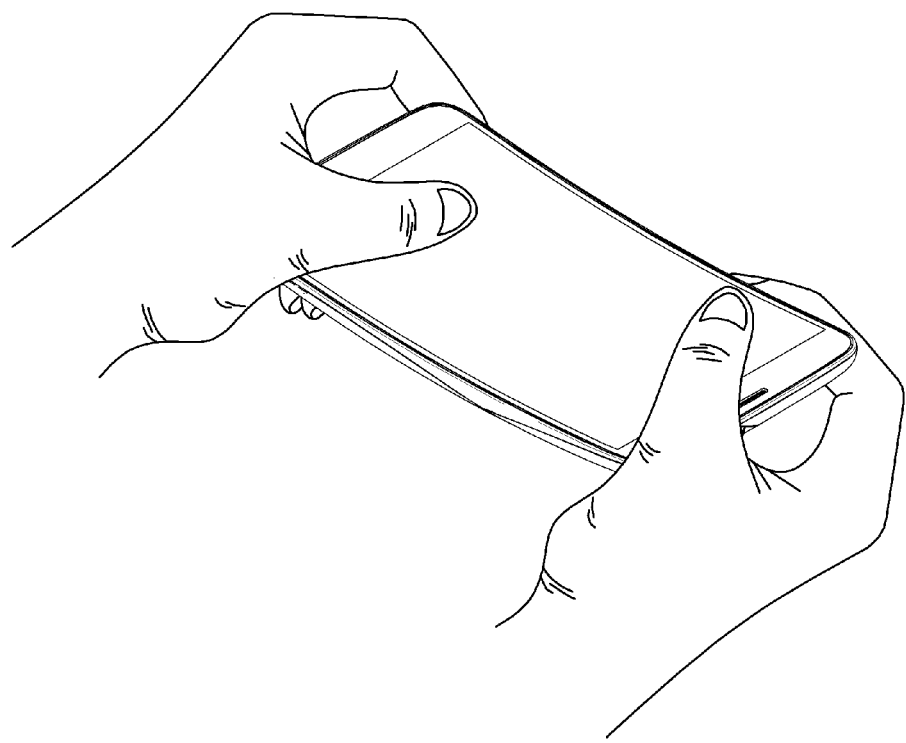

[Fig. 23]
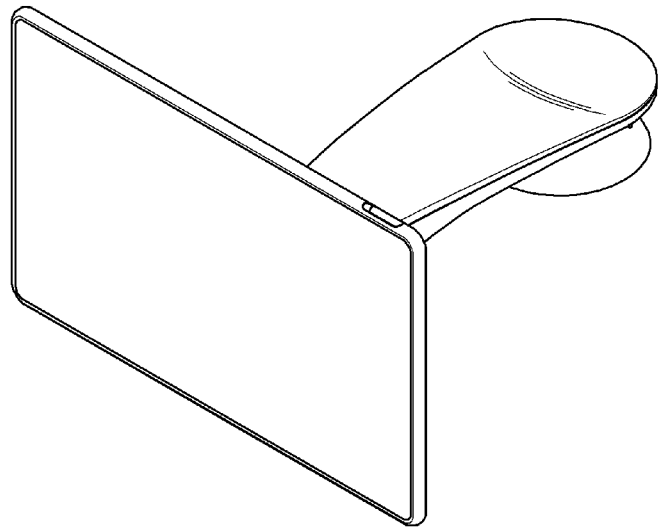
[Fig. 24]

TOUCH WINDOW AND DISPLAY WITH THE SAME

CROSS-REFERENCE TO RELATED PATENT APPLICATIONS

This application is a U.S. National Stage Application under 35 U.S.C. § 371 of PCT Application No. PCT/KR2015/001354, filed Feb. 10, 2015, which claims priority to Korean Patent Application Nos. 10-2014-0021238, filed Feb. 24, 2014, 10-2014-0023643, filed Feb. 27, 2014, and 10-2014-0025723, filed Mar. 4, 2014, whose entire disclosures are hereby incorporated by reference.

TECHNICAL FIELD

The disclosure relates to a touch window and a display including the same.

BACKGROUND ART

Recently, a touch panel, which performs an input function through the touch of an image displayed on a display by an input device, such as a stylus pen or a finger, has been applied to various electronic appliances.

The touch panel may be representatively classified into a resistive touch panel and a capacitive touch panel. In the resistive touch panel, the position of the touch point is detected by detecting the variation of resistance according to the connection between electrodes when pressure is applied to the input device. In the capacitive touch panel, the position of the touch point is detected by detecting the variation of capacitance between electrodes when a finger of the user is touched on the capacitive touch panel. When taking into consideration the convenience of a fabrication scheme and a sensing power, the capacitive touch panel has been spotlighted in a smaller model touch panel recently.

Indium tin oxide (ITO), which has been generally known to those skilled in the art, may be used as a transparent electrode of the touch panel. However, the ITO electrode may have many problems. In the ITO electrode, since an indium material constituting the ITO is rare and vacuum processes, such as sputtering and chemical deposition processes, are essentially required for the ITO coating, the manufacturing process cost are relatively high. In addition, since the ITO electrode is physically easily damaged due to the bending or the curving of a substrate, so that the characteristic of the ITO for the electrode part is deteriorated. Accordingly, the ITO electrode may be not suitable for a flexible device. Further, the ITO electrode represents high resistance and has a limitation in a large size.

In order to solve the problem, researches and studies on an alternative electrode have ben actively carried out. The substitute for ITO is formed by making the shape of the mesh using metallic materials. When the mesh is formed, the mesh may be formed using a nano-pattern and a micro-pattern. For example, a resin layer is formed on the substrate, and imprinted using a mold, so that a pattern may be formed. Thereafter, the electrode layer may be formed on the pattern.

Photocurable resin may be used for a resin layer used in an imprinting process. In general, the photocurable resin is greatly contracted in volume, and has a cross-linking density less than that of other resins. In addition, different resins must be used depending on the types of substrates used when the mold is formed. In addition, the resin must be bonded to the substrate. However, if the substrate is formed of a material difficult in the adhesion to the substrate, the resin layer may be separated from the substrate.

Meanwhile, in the case of the touch window, a moire phenomenon, a black-out phenomenon (a screen is viewed in black at a specific angle) and a rainbow phenomenon (rainbow stains) may occur to exert a malicious influence on visibility.

Meanwhile, recently, the requirement for the flexible touch panel is increased. In other words, if the touch panel is flexible or bendable, the experience of a user will extend. However, indium tin oxide (ITO), which is most widely used material for the transparent electrode of the touch panel, is easy to be physically damaged when the substrate is flexed and bent, so that the electrode property is deteriorated. Therefore, the indium tin oxide (ITO) is not suitable for a flexible device.

DISCLOSURE OF INVENTION

Technical Problem

The embodiment provides a touch window having improved reliability and a display including the same.

Solution to Problem

According to the embodiment, there is provided a touch window including a substrate, and an electrode layer on the substrate. A retardation difference is 0.2% or less depending on an incident angle of light in the substrate.

Advantageous Effects of Invention

In addition, the substrate has an approximately equal refractive index regardless of directions including a plane direction or a thickness direction. Accordingly, a moire phenomenon, a black-out phenomenon (a screen is viewed in black at a specific angle), and a rainbow phenomenon (a rainbow stain) can be improved, so that the visibility can be improved.

In addition, the water absorption of the substrate is 0.1% or less. Accordingly, even if the substrate is exposed to an environment having high humidity, water can be prevented from being absorbed into the touch window, so that the reliability and the durability can be improved. In addition, the electrode part provided on the substrate can be prevented from water absorption.

In addition, the electrode part provided on the substrate can be prevented from water absorption and the bonding strength between the substrate and the electrode part provided on the substrate can be improved. Therefore, even if the electrode part includes various types of materials, the electrode part is not peeled off or film-delaminated, but can be stably formed.

In addition, the resin composition according to the embodiment constitutes the pattern layer of the electrode part, less contracts the volume of the touch widow, increases a cross-linking density, and represents a bonding characteristic to various materials. Accordingly, even if the substrate includes a material difficult in bonding, the touch window can have bonding performance.

In addition, a problem of employing different resin compositions according to substrates can be solved as the resin composition represents superior bonding strength regardless of the materials constituting the substrate.

According to the embodiment, the first and second electrode parts are provided on the same plane of the substrate, so that the thickness of the touch window can be reduced, and the visibility can be improved. In other words, when the first and second electrode parts are provided on different substrates, the thickness of the touch window may be increased. In addition, when viewed from the top, the conductive patterns of the first and second electrode parts overlap with each other, thereby causing a moire phenomenon. According to the embodiment, the first and second electrode parts are provided on one plane to prevent the moire phenomenon.

In addition, the electrode part includes a conductive pattern, so that the bending characteristic and the reliability of the touch window can be improved.

BRIEF DESCRIPTION OF DRAWINGS

FIG. 1 is a plan view schematically showing a touch window according to the first embodiment.

FIG. 2 is an enlarged view showing a part A of FIG. 1.

FIG. 3 is a sectional view taken along line I-I' of FIG. 2.

FIGS. 4 and 5 are enlarged views showing a touch window according to another embodiment.

FIGS. 6 and 7 are graphs to explain a substrate according to the first embodiment.

FIG. 8 is a sectional view showing a touch window according to another embodiment.

FIG. 9 is an exploded perspective view showing a touch window according to another embodiment.

FIG. 10 is a sectional view taken along line A-A' of FIG. 9.

FIG. 11 is an exploded perspective view showing a touch window according to another embodiment.

FIG. 12 is a sectional view taken along line B-B' of FIG. 11.

FIG. 13 is an exploded perspective view showing the touch window according to another embodiment.

FIG. 14 is a sectional view taken along line C-C' of FIG. 13.

FIG. 15 is an exploded perspective view showing the touch window according to another embodiment.

FIG. 16 is a sectional view taken along line D-D' of FIG. 15.

FIG. 17 is an exploded perspective view showing the touch window according to another embodiment.

FIG. 18 is a sectional view taken along line E-E' of FIG. 17.

FIGS. 19 and 20 are sectional views a touch device formed by coupling the touch window according to the embodiments to the display panel.

FIGS. 21 to 24 are perspective views showing a display according to the embodiment.

MODE FOR THE INVENTION

In the description of the embodiments, it will be understood that, when a layer (or film), a region, a pattern, or a structure is referred to as being "on" or "under" another layer (or film), another region, another pad, or another pattern, it can be "directly" or "indirectly" on the other layer (or film), region, pad, or pattern, or one or more intervening layers may also be present. Such a position of the layer has been described with reference to the drawings.

Hereinafter, the embodiment of the disclosure will be described in detail with reference to accompanying drawings.

FIG. 1 is a plan view schematically showing a touch window according to the first embodiment. FIG. 2 is an enlarged view showing a part A of FIG. 1. FIG. 3 is a sectional view taken along line I-I' of FIG. 2. FIGS. 4 and 5 are enlarged views showing a touch window according to another embodiment.

FIGS. 6 and 7 are graphs to explain a substrate according to the first embodiment.

First, the touch window according to the embodiment will be described with reference to FIGS. 1 to 7.

A touch window according to the embodiment includes an active region AA to detect the position of an input device (e.g., finger) and an unactive region UA provided at a peripheral portion of the active region AA.

In this case, an electrode part 200 may be formed in the active area AA to detect the input device. In addition, a wire 300 may be formed in the unactive area UA for the electrical connection of the electrode part 200. In addition, an external circuit, which is connected with the wire 300, may be positioned in the unactive area UA.

If the input device, such as a finger, touches the touch window, the variation of capacitance occurs in the touched part by the input device, and the touched part subject to the variation of the capacitance may be detected as a touch point.

The retardation difference depending on the incident angle of light in the substrate 100 may be less than 0.2%. In detail, the retardation difference depending on the incident angle of light in the substrate 100 may be in the range of 0.001% to 0.2%. In this case, if the retardation difference depending on the incident angle of light in the substrate 100 is less than 0.001%, the substrate 100 may not be manufactured actually. In addition, if the retardation difference depending on the incident angle of light in the substrate 100 is more than 0.2%, the display employing the substrate 100 may be significantly affected by a use environment. In other words, when the user uses the display indoors and outdoors, the user may greatly feel the sense of difference on the screen depending on the incident angle of light. In addition, a blackout phenomenon (the screen is viewed in black at a specific angle) may occur.

In addition, referring to FIG. 3, the retardation depending on the incident angle of light in the substrate 100 may be 5 or less. In detail, the retardation depending on the incident angle of light in the substrate 100 is in the range of 0 to 5. Actually, it may be difficult to fabricate the substrate 100 having the retardation of 0 or less depending on the incident angle of light in the substrate 100. In addition, if the retardation depending on the incident angle of light in the substrate 100 is greater than 5, the display employing the substrate 100 may be significantly affected by a use environment. In other words, when the user uses the display indoors and outdoors, the user may greatly feel the sense of difference on the screen depending on the incident angle of light. In addition, a blackout phenomenon (the screen is viewed in black at a specific angle) may occur.

Meanwhile, polycarbonate (PC) used in the substrate 100 or polyethylene phthalate (PET) used for a typical substrate has a retardation value of 20 or more. However, the substrate 100 has a retardation value of 5 or less. Accordingly, the display applied to the substrate 100 may have the same characteristic or the similar characteristic due to the substrate 100 according to the embodiment without the influence exerted on the user environment. In other words, when the user uses the display indoors and outdoors, the user may greatly feel the sense of difference on the screen depending on the incident angle of light. In addition, a blackout phenomenon (the screen is viewed in black at a specific angle) may occur.

Meanwhile, the substrate 100 has water absorption of 0.1% or less. In other words, the substrate 100 has water absorption exceeding 0% and equal to or less than 0.1%. Actually, it may be impossible to fabricate the substrate 100 having the water absorption of 0% or less. In addition, when the water absorption exceeds 0.1%, and when the substrate 100 is exposed to an environment having high humidity, the reliability of the substrate 100 may be degraded due to the water absorption. In addition, as the substrate 100 is exposed to the environment having the high humidity, the rainbow phenomenon may occur due to the absorption of water.

Accordingly, even if the touch window is exposed to the environment having high humidity, the substrate 100 according to the embodiment can prevent water from being absorbed into the touch window, so that the reliability and the durability can be improved. In other words, the electrode part is provided on the substrate 100, so that the electrode part can be prevented from water absorption. In addition, even if the electrode part is exposed to the environment having high humidity, the rainbow phenomenon may be prevented.

The retardation of the substrate 100 may be inspected by an optical characteristic inspector of the retardation film. In addition, the inspector measures a phase retardation value through a rotation interference scheme, or an optical interference scheme to measure the retardation value of the substrate 100.

Meanwhile, referring to FIG. 7, the wavelength dispersion of the substrate 100 at 400 nm to 700 nm is in the range of 0.9 to 1.1. Preferably, the wavelength dispersion of the substrate 100 at 400 nm to 700 nm is in the range of 1.0 to 1.1. In addition, the wavelength dispersion of the substrate 100 is uniform regardless of the positions of the substrate 100. Actually, it may be impossible to fabricate the substrate 100 having the wavelength dispersion of 0.9 or less at 400 nm to 700 nm. If the wavelength dispersion of the substrate 100 at 400 nm to 700 nm exceeds 1.1, the variation of the reflective index is greatly represented according to the wavelength of the light, so that the rainbow phenomenon may occur.

Accordingly, even if the substrate 100 is exposed to various wavelength bands, the substrate 100 may have the same characteristic or similar characteristics. In addition, the rainbow phenomenon In addition, the substrate 100 has an equal refractive index or an approximate refractive index regardless of directions. Accordingly, a moire phenomenon can be prevented, so that the visibility can be improved.

In addition, the bonding strength between the substrate 100 and the electrode part 200 provided on the substrate 100 can be improved. Accordingly, the electrode part 200 can be stably formed on the substrate 100 regardless of materials constituting the electrode part 200 without the peel off or the film-delamination from the substrate 100.

The substrate 100 may include an optically isotropic material. For example, the substrate 100 may include cyclic olefin copolymer (COC), cyclic olefin polymer (COP), optically isotropic polycarbonate (PC), or optically isotropic polymethyl methacrylate (PMMA). The electrode part 200 may be formed on the substrate 100. The electrode part 200 may be provided on the active region AA of the substrate 100. Although drawings show that the slight difference is made in the thickness between the substrate 100 and the electrode part 200 for the convenience, a greater difference may be made in the thickness between the substrate 100 and the electrode part 200 in an actual product.

An outer dummy layer is formed in the unactive area UA of the substrate 100. The outer dummy layer may be coated with a material having a predetermined color so that a wire 300 and a printed circuit board connecting the wire 300 to an external circuit cannot be viewed from the outside. The outer dummy layer may have a color suitable for a desired outer appearance thereof. In addition, a desired logo may be formed in the outer dummy layer through various schemes. The outer dummy layer may be formed through deposition, print, and wet coating schemes.

The electrode part 200 may be formed on the substrate 100. The electrode part 200 may be provided on the active region AA of the substrate 100. The electrode part 200 may be provided on the active region AA so that the electrode part 200 serves as a sensor to sense the touch. In other words, the electrode part 200 may sense the touch by the input device such as a finger. The electrode part 200 includes first and second electrode parts 210 and 220.

The first electrode part 210 includes a first sensor part 230 and a first sensor connection part 250 for the connection with the first sensor part 230. The first sensor part 230 may extend in one direction. In addition, the first sensor connection part 250 may connect the first sensor part 230 in one direction.

The second electrode part 220 includes a sensor part 240 and a second sensor connection part 260 for the connection with the second sensor part 240. The second sensor part 240 may extend in another direction crossing the one direction. In addition, the second sensor connection part 260 may connect the second sensor part 240 in another direction.

The first sensor part 230, the second sensor part 240, and the second sensor connection part 260 are provided on the substrate 100. The first sensor part 230, the second sensor part 240, and the second sensor connection part 260 may be provided on the substrate 100 in direct contact with the substrate 100. The first sensor part 230, the second sensor part 240, and the second sensor connection part 260 are provided on the same plane.

Meanwhile, the first sensor connection part 250 electrically connects the first sensor part 230. In this case, an insulating part 420 is interposed between the first sensor connection part 250 and the second sensor connection part 260. The insulating part 420 can prevent the electrical short between the first sensor connection part 250 and the second sensor connection part 260. The insulating part 420 may be formed of a transparent insulating material to insulate the first sensor connection part 250 from the second sensor connection part 260. For example, the insulating part 420 may include a metallic oxide such as a silicon oxide or acrylic resin.

Although FIG. 2 shows that the electrode part 200 may include two types of electrode parts having a shape extending in one direction and a shape in another direction on the substrate 100, the embodiment is not limited thereto. Accordingly, the electrode part 200 may have only the shape extending in one direction.

In addition, although FIG. 2 shows that the electrode part 200 is provided in a diamond shape, the embodiment is not limited thereto. The electrode part 200 may be provided in various shapes such as a bar shape, a polygonal shape including a triangular shape, or a rectangular shape, a linear H shape, and an oval shape.

Meanwhile, the electrode part 200 is provided in a mesh shape. In this case, the mesh shape may be randomly formed to prevent a moire phenomenon. The moire phenomenon occurs when periodical stripes overlap with each other. Since adjacent stripes overlap with each other, a thickness of a stripe is thickened so that the stripe is spotlighted as compared with other stripes. In order to prevent the moire phenomenon, the conductive pattern shape may be variously formed.

In detail, the electrode part 200 includes a mesh opening part OA and a mesh line part LA. In this case, the mesh line part LA has a line width of 0.1 μm to 10 μm. If the line width of the mesh line part LA is 0.1 μm or less, the mesh line part LA may not be manufactured. If the line width of the mesh line part LA is 10 μm or less, the pattern of the electrode part 200 may not be viewed. Preferably, the line width of the mesh line part LA may be in the range of 0.1 μm to 10 μm.

Meanwhile, as shown in FIG. 2, the mesh opening part OA may have a rectangular shape, but the embodiment is not limited thereto. The mesh opening part OA may have various shapes such as a polygonal shape including a diamond shape, a diamond shape, a pentagonal shape, or a hexagonal shape, or a circular shape.

The electrode part 200 has the mesh shape, so that the pattern of the electrode part 200 may not be viewed in the active region AA. In other words, even if the electrode part 200 includes metal, the pattern may not be viewed. In addition, even if the electrode part 200 is applied to a large-size touch window, the resistance of the touch window may be lowered. In addition, when the electrode part 200 is formed through a printing process, printing quality can be improved, so that a high-quality touch window can be ensured.

Referring to FIG. 3, the electrode part 200 may include a pattern layer 280 and an electrode layer 270. In this case, the pattern layer 280 may include first and second sub-patterns 281 and 282.

The pattern layer 280 is provided on the substrate 100. The pattern layer 280 may include a photocurable resin. In this case, the pattern layer 280 may include a resin composition according to the embodiment The resin composition according to the embodiment may include (a) urethane acrylate oligomer, (b) monomer having a double bond, (c) a photoinitiator, and (d) a curing accelerator. In addition, the resin composition may further include (e) additives.

The urethane acrylate oligomer may consist of polyol and isocyanate. The urethane acrylate oligomer is terminated with an acrylic group or a methacrylic group.

The polyol may include one selected from the group consisting of polycarbonate polyol, polycaprolactone polyone and the combination thereof. For example, the polyol may include at least one of repetition units expressed in formula 1 and formula 2.

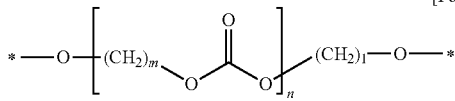

[Formula 1]

The l, m, and n are integers selected in the range of 1 to 30.

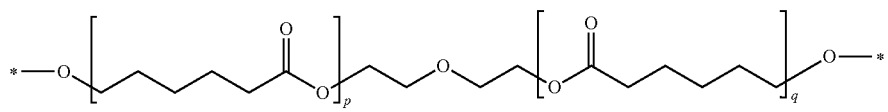

[Formula 2]

The p and q are integers selected in the range of 1 to 50.

The polyol may further include a repetition unit expressed in Formula 3 in addition to repetition units expressed in formula 1 and formula 2.

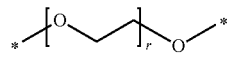

[Formula 3]

The r is an integer selected in the range of 0 to 30. The polyol includes the repetition unit expressed in formula 3 to adjust a molecular weight of the urethane acrylate oligomer and adjust compatibility and a mechanical property. If necessary, ethylene oxide may be added to the polyol so that the polyol includes the repetition unit expressed in Formula 3.

The polyol includes one selected from the group consisting of polycarbonate polyol, polycaprolactone polyol and the combination thereof, and may further include one selected from the group consisting of a linear polyol, a circular polyol, and the combination thereof.

The linear polyol may include one selected from the group consisting of 1,4-butanediol, 1,5-pentanediol, 3-methyl-1,5-pentanediol 1,6-hexanediol, 3-methyl-1,6-hexanediol, and the combination thereof, but the embodiment is not limited thereto.

The circular polyol may include one selected from the group consisting of benzenediol, naphthalenediol, bis(4-hydroxydiphenyl)methane, 1,1-bis(4-hydroxyphenyl)ethane, 2,2-bis(4-hydroxyphenyl)propane, 2,2-bis(4-hydroxyphenyl)butane, 1,1-bis(4-hydroxyphenyl)-1-phenylethane, 2,2-bis(4-hydroxyphenyl)hexafluoropropane, bis-(4-hydroxyphenyl)diphenylmethane, 2,2-bis(3-methyl-4-hydroxyphenyl)propane, and the combination thereof, but the embodiment is not limited thereto.

The isocyante may be circular isocyante or linear isocyante having at least two functional groups. For example, the isocyante may include any one selected from the group consisting of methylene-bis(4-cyclohexylisocyanate, isophorone diisocyanate, 1,4-cyclohexane diisocyanate, 2,4-toluene diisocyanate, 2,6-toluene diisocyanate, cyclohexylene-1,2-diisocyanate, 1,5-naphthalene diisocyanate, 4-methoxy-1,3-phenylene diisocyanate, 4-chloro-1,3-phenylene diisocyanate, 2,4-dimethyl-1,3-phenylene diisocyanate, diphenyl ether-4,4'-diisocyanate, 4,4'-dibenzyl diisocyanate, methylenebis(4-phenyl isocyanate), 1,3-phenylene diisocyanate, hexamethylenediisocyanate, 1,4-tetramethylene diisocyanate, 1,1-bis(acryloyloxymethyl)ethyl isocyanate, 2-methacryloyloxyethyl isocyanate, and the combination thereof.

The urethane acrylate oligomer forms a basic structure of a resin composition constituting the pattern layer 280, and exerts an influence on the bonding property and the physical property of the resin composition. When the pattern layer 280 is bonded to the substrate 100 and cured, the urethane acrylate oligomer less causes the volume contraction to improve surface roughness. In addition, the urethane acrylate oligomer improves the bonding property. Accordingly, although the substrate 100 includes various materials, the substrate 100 may have the bonding property. The monomer having a double bond may include a monomer having a chain structure. In addition, the monomer may include a circular monomer. The monomer may be one type of monomer, or may be a monomer obtained by mixing at least two types of monomers.

The monomer having the chain structure may be one of 1,4-butanediol dimethacrylate, dimethylaminoethyl methacrylate, 2-ethylhexyl methacrylate, iso-decyl methacrylate, glycidyl methacrylate, n-butyl methacrylate, 2-phenylethyl methacrylate, hexyl methacrylate, decyl methacrylate, 1,6-hexanediol dimethacrylate, ethoxylated bisphenol-A dimethacrylate, t-butylaminoethyl methacrylate, isoamyl methacrylate, isobutyl methacrylate, diethylene glycol dimethacrylate, triethylene glycol dimethacrylate, 1,3-butanediol dimethacrylate, and the combination thereof.

In addition, the monomer having the circular structure may include one selected from the group consisting of dicyclopentanyl methacrylate, ethyleneglycol dicyclopentenyl ether methacrylate, 2-methylcyclohexyl methacrylate, dicyclopentenyl ether methacrylate, isobornyl ethoxy methacrylate, tetrahydrofurfuryl methacrylate, tetrahydrofuran-3-yl methacrylate, isobornyl methacrylate, furfuryl methacrylate, and the combination thereof.

The monomer having the chain structure included in the monomer having the double bond has a wet property for the substrate 100 and a filling property for the mold pattern. In addition, the pattern layer 280 including the resin composition is less contracted in volume, and allows the viscosity adjustment. In addition, the monomer having the circular structure included in the monomer having the double bond is rarely contracted in volume when the resin composition is cured. In other words, the monomer having the circular structure is less contracted in volume and allows the viscosity adjustment.

The photoinitiator photocures the resin composition.

The photoinitiator may be used by mixing one type of a photoinitiator or two types of photoinitiators. When at least two types of photoinitiators are used, the photoinitiator is used by appropriately mixing short and long wavelength band initiators with each other. In this case, the wavelength band of the photoinitiator may be adjusted by the material of the substrate 100.

For example, the photoinitiator may include any one selected from the group consisting of 2-hydroxy-2-methyl-1-phenylpropan-1-one (Darocur 1173, Ciba), 2,2-dimethoxy-1,2-diphenylethan-1-one (Irgacure 651, Ciba), 1-hydroxycyclohexylphenylketone (Irgacure 184, Ciba), 2-methyl-1-[4-(methylthio)phenyl]-2-(4-morpholinylpropan-1-one (Irgacure 907, Ciba), bis(2,4,6-trimethylbenzoyl)-phenylphosphine oxide (Irgacure 819, Ciba), 2,4,6-trimethylbenzoyldiphenylphosphine oxide (Darocur TPO, Ciba), and the combination thereof, but the embodiment is not limited thereto.

The curing accelerator performs the function of an attachment enhancer. The curing accelerator contributes to the enhancement of a cross-linking density, a curing rate, and a bonding strength to a substrate. The curing accelerator may employ a multifunctional acrylate having at least three functional groups.

For example, the curing accelerator may include one selected from the group consisting of trimethylolpropane triacrylate, glycerine propoxylated triacrylate, pentaerythritol triacrylate, dimethylolpropane tetraacrylate, pentaerythritol tetraacrylate, dipentaerythritol pentaacrylate, dipentaerythritol hexa(meth)acrylate, and the combination thereof, but the embodiment is not limited thereto.

In particular, the resin composition including the dendritic acrylate expressed in formula 4 as the curing accelerator has a rapid curing rate since general multifunctional acrylate has the viscosity of 10,000 cPs or more at the temperature of 25° C. while the dendritic acrylate expressed in formula 4 has the viscosity of about 500 cPs at the temperature of 25° C.

[Formula 4]

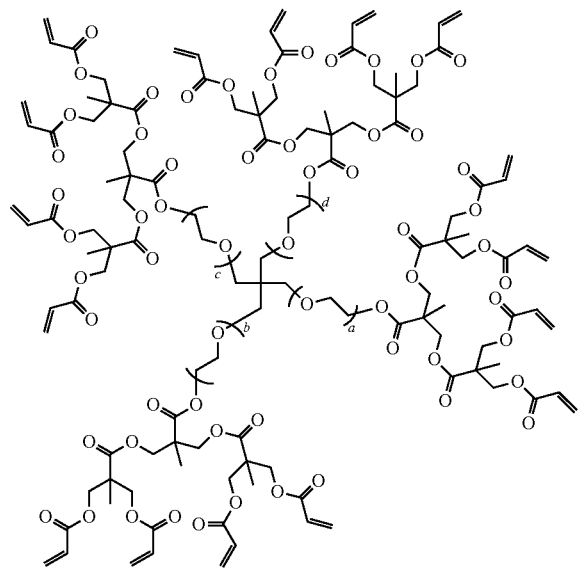

The a, b, c, and d are integers selected in the range of 0 to 5 while satisfying a+b+c+d=5.

The additives may include one selected from the group consisting of anti-foaming agents, wetting agents, dispersants, rheological additives, and the combination thereof.

The resin composition constituting the pattern layer 280 may include 10 weight % to 65 weight % of urethane acrylate oligomer, 20 weight % to 90 weight % of monomer having a double bond, 0.1 weight % to 10 weight % of a photoinitiator, and 3 weight % to 10 weight % of a curing accelerator. The resin composition may further include 0.5 weight % to 10 weight % of additives.

If 10 weight % or less of urethane acrylate oligomer is included in the resin composition, the bonding strength of the composition may be degraded, and the shape of the pattern layer 280 may not be maintained. In addition, after the pattern layer 280 has been coated on the substrate 100, the shape of the pattern layer 280 may not be maintained so that the pattern layer 280 may be separated from the substrate 100. If the content of the urethane acrylate oligomer exceeds 65 weight %, the viscosity of the composition is increased, so that the curing rate may be reduced. For this reason, the resin composition may include 10 weight % to 65 weight % of urethane acrylate oligomer. Preferably, the content of urethane acrylate oligomer is preferably in the range of 25 weight % to 60 weight %.

If less than 20 weight % of the monomer having the double bond is included in the resin composition, it may be difficult to adjust the viscosity of the resin composition to a lower value. If more than 90 weight % of the monomer having the double bond is included in the resin composition, it may be difficult to maintain the shape of the pattern layer 280. For this reason, the content of monomer having the double bond is preferably in the range of 20 weight % to 90 weight %.

If less than 0.1 weight % of the photoinitiator is included in the resin composition, the degree of polymerization may be degraded when the pattern layer 280 is cured. If more than 10 weight % of the photoinitiator is included in the resin composition, the viscosity may be degraded, so that the pattern layer 280 may be separated from the substrate 100. For this reason, the content of the photoinitiator may be preferably in the range of 0.1 weight % to 10 weight %.

If less than 3 weight % of the curing accelerator is included in the resin composition, the cross-linking density of the composition is reduced when the composition is cured, so that the bonding strength and the mechanical strength of the pattern layer 280 may be degraded. If more than 10 weight % of the curing accelerator is included in the resin composition, the shape of the cured layer obtained from the resin composition may no be maintained. For this reason, the content of the curing accelerator may be preferably in the range of 3 weight % to 10 weight %.

The resin composition may be obtained by adding (a) an urethane acrylate oligomer, (b) a monomer having a double bond, (c) a photoinitiator, and (d) a curing accelerator, adding (e) additives if necessary, and mixing the urethane acrylate oligomer, the monomer having the double bond, the photoinitiator, and the curing accelerator with each other using a stirrer or a paste mixture, the embodiment is not limited thereto.

The resin composition improves the bonding strength of the pattern layer 280. Accordingly, even if the pattern layer 280 includes various materials, the pattern layer 280 may have a bonding property. For example, even if the substrate 100 has the retardation difference of 0.2% or less depending on the incident angle of light in the substrate 100, the pattern layer 280 may have a bonding property to the substrate 100. For example, even if the substrate 100 includes one selected from the group consisting of polyethylene terephthalate (PET), polycarbonate (PC), poly(methyl methacrylate) (PMMA), cyclic olefin copolymer (COC), and cyclic olefin polymer (COP), the pattern layer 280 may have a bonding property to the substrate 100.

Conventional photocurable resin is contracted in volume and has a cross-linking density less than that of other resins, so that the photocurable resin has an insufficient bonding strength to the substrate 100, and the failure may occur in the process of separating from the mold. In addition, the substrate 100 may include various materials. The substrate 100 has a difficulty to use various resins depending on the material of the substrate 100.

However, the resin composition according to the present invention is less contracted in volume, has a high cross-linking density, and has a bonding characteristic with various materials. In other words, an optically isotropic film is a material difficult to be bonded, and a conventional photocurable resin has a difficulty when the photocruable resin adheres to the optically isotrphic film. However, the resin composition according to the present invention can be bonded to the material, such as an optically isotrphic film, difficult to be bonded. In other words, for example, even if the substrate 100 includes an optically isotrphic film such as COC, COP, optically isotrphic PC (polycarbonate), and optically isotropic PMMA, the pattern layer 280 including the resin composition according to the present invention may have an adhesive property to the substrate 100.

Meanwhile, referring to FIG. 3, the pattern layer 280 may include the first and second sub patterns 281 and 282.

The first sub-pattern 281 is provided on the substrate 100. The first sub-pattern 281 is provided on the mesh line part LA. Accordingly, the first sub-pattern 281 is provided in the mesh shape. The first sub-pattern 281 may be an embossed pattern.

The second sub-pattern 282 is provided on the substrate 100. The second sub-pattern 282 is provided in the mesh opening part OA. Accordingly, the second sub-pattern 282 may be provided between first sub-patterns 281. The second sub-pattern 282 may be an embossed pattern The first and second sub-patterns 281 and 282 may include resin or polymer. The first and second sub-patterns 282 may be formed through an imprinting process. In other words, a desired pattern may be formed on the resin layer 150 through a mold having the desired pattern. Although drawings show that the first and second sub-patterns 281 and 282 are represented in a protrusion part having a rounded corner, the embodiment is not limited thereto. The shape of the protrusion shape may have various shapes if necessary.

In the pattern layer 280 formed of the resin composition, when the first and second sub-patterns 281 and 282 are formed through the imprinting process using the mold, a superior filling characteristic into the mold pattern can be represented, and a superior bonding strength to the substrate 100 can be represented. Accordingly, the failure of the first sub-pattern 281 can be prevented. In addition, the electrode layer 270 can be formed without damage on the first sub-pattern 281. Accordingly, the disconnection of the electrode layer 270 can be prevented and the reliability of the electrode layer 270 can be improved.

The electrode layer 270 is provided on the first sub-pattern 281. The electrode layer 270 may be provided on the entire surface of the first sub-pattern 281. In other words, the electrode layer 270 may be provided on the first sub-pattern 281 while surrounding the first sub-pattern 281. Accordingly, the electrode layer 270 is provided in the mesh line part LA, and provided in a mesh shape. The electrode layer 270 may include various metals having superior electrical conductivity. For example, the electrode layer 270 may include Cu, Au, Ag, Al, Ti, Ni and the alloy thereof.

An electrode material may be formed on the first and second sub-patterns 281 and 282. The electrode material may be formed through a deposition or plating scheme.

Thereafter, the electrode material may be etched. In this case, an etched area may be varied depending on the difference between the structures of the first and second sub-patterns 281 and 282, and the difference between the contact areas of the first and second sub-patterns 281 and 282 to the electrode material. In other words, since the contact area of the first sub-pattern 281 to the electrode material is wider than the contact area between the second sub-pattern 282 to the electrode material, the electrode material is less etched on the first sub-pattern 281. In other words, when the etching is performed at the same etching rate, the electrode material on the first sub-pattern 281 remains, and the electrode material on the second sub-pattern 282 is etched and removed. Meanwhile, the electrode material may be formed only on the first sub-pattern 281, and the electrode layer 270 may be provided in the mesh shape.

In particular, a width W1 of the first sub-pattern 281 is wider than a width W2 of the second sub-pattern 282. The ratio of the width W1 of the first sub-pattern 281 to the width W2 of the second sub-pattern 282 may be in the range of 1:0.03 to 1:0.05. The ratio of the width W1 of the first sub-pattern 281 to the height H1 of the first sub-pattern 281 may be in the range of 1:0.1 to 1:1. The ratio of the height H1 of the first sub-pattern 281 to a height H2 of the second sub-pattern 282 may be in the range of 1:0.1 to 1:1. The etching property for the electrode layer 270 can be improved due to the ratio. In other words, the electrode layer 270 may be etched so that the electrode layer 270 may not remain at parts other than the first sub-pattern 281. In addition, since the fine line width can be realized, so that the transmittance and the visibility of the touch window can be improved.

Meanwhile, the first and second electrode parts 210 and 220 are provided on the same plane of the substrate 100, so that the thickness of the touch window can be reduced, and the visibility can be improved. In other words, when the first and second electrode parts 210 and 220 are provided on mutually different substrates, respectively, the thickness of the touch window may be increased. When viewed from the top, the conductive pattern of the first electrode part 210 may be overlapped with the conductive pattern of the second electrode part 220, thereby causing the moire phenomenon. However, according to the embodiment, the first and second electrode parts 210 and 220 are provided on one plane to prevent the moire phenomenon.

In addition, the electrode part 200 includes a conductive pattern, so that the bending characteristic and the reliability of the touch window can be improved.

Thereafter, the wire 300 is formed on the unactive region UA. The wire 300 may apply an electrical signal to the electrode part 200. The wire 300 is formed in the unactive region UA, so that the wire 300 may not be viewed.

Meanwhile, although not shown in drawings, a printed circuit board connected with the wire 300 may be further positioned in the touch window. The printed circuit board may employ various types of printed circuit boards. For example, a flexible printed circuit board (FPCB) may be employed.

Hereinafter, a touch window according to another embodiment will be described with reference to FIG. 8. FIG. 8 is a sectional view showing the touch window according to another embodiment. In the following description, the details of the structures and the components the same as or similar to those according to prior embodiments will be omitted.

Referring to FIG. 8, a substrate 100 has an active region and an unactive region provided around the active region. An electrode part 200 is formed in the unactive region. The electrode part 200 may include a pattern layer 280 and an electrode layer 270. In this case, the pattern layer 280 may include an intaglio part 283 and an embossed part 284.

The retardation difference depending on the incident angle of light in the substrate 100 may be less than 0.2%. In detail, the retardation difference depending on the incident angle of light in the substrate 100 may be in the range of 0.001% to 0.2%. The retardation depending on the incident angle of light in the substrate 100 may be in the range of 0 nm to 5 nm. The substrate 100 has the same refractive index regardless of directions, such as a plane direction or a thickness direction. In addition, the water absorption of the substrate 100 may exceed 0% and 0.1% or less.

In addition, the wavelength dispersion of the substrate 100 at 400 nm to 700 nm is in the range of 0.9 to 1.1. Preferably, the wavelength dispersion of the substrate 100 at 400 nm to 700 nm is in the range of 1.0 to 1.05. In addition, the wavelength dispersion of the substrate 100 is uniform regardless of positions of the substrate 100.

The substrate 100 may include an optically isotropic material. For example, the substrate 100 may include cyclic olefin copolymer (COC), cyclic olefin polymer (COP), optically isotropic polycarbonate (PC), or optically isotropic polymethyl methacrylate (PMMA).

Accordingly, the touch window according to the present invention can improve a moire phenomenon, a black-out phenomenon (the screen is viewed in black at a specific angle) and a rainbow phenomenon (rainbow stains). In other words, visibility can be improved. In addition, even if the touch window is exposed to an environment having high humidity, the touch window can be prevented from water absorption, so that the reliability and the durability of the touch window can be improved.

In other words, the electrode part 200 is provided on the substrate 100, so that the water absorption of the electrode part 200 can be prevented. In addition, the bonding strength to the electrode part 200 formed on the substrate 100 can be improved. Accordingly, the electrode part 200 can be stably formed on the substrate 100 regardless of materials constituting the electrode part 200 without the peel off or the film-delamination from the substrate 100.

The pattern layer 280 is provided on the substrate 100. The pattern layer 280 may include photocurable resin. In this case, the pattern layer 280 may be formed of resin composition according to the embodiment.

The resin composition according to the embodiment may include (a) urethane acrylate oligomer, (b) monomer having a double bond, (c) a photoinitiator, and (d) a curing accelerator. In addition, the resin composition may further include (e) additives. The resin composition may include the same resin composition as that constituting the pattern layer 280 of the touch window according to the first embodiment.

The resin composition constituting the pattern layer 280 may include 10 weight % to 65 weight % of urethane acrylate oligomer, 20 weight % to 90 weight % of monomer having a double bond, 0.1 weight % to 10 weight % of a photoinitiator, and 3 weight % to 10 weight % of a curing accelerator. The resin composition may further include 0.5 weight % to 10 weight % of additives.

The urethane acrylate oligomer may consist of polyol and isocyanate. The urethane acrylate oligomer is terminated with an acrylic group or a methacrylic group.

The polyol may include one selected from the group consisting of polycarbonate polyol, polycaprolactone polyone and the combination thereof. For example, the polyol may include at least one of repetition units expressed in formula 1 and formula 2.

[Formula 1]

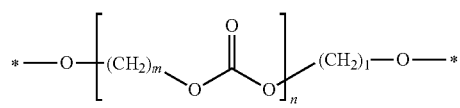

The l, m, and n are integers selected in the range of 1 to 30.

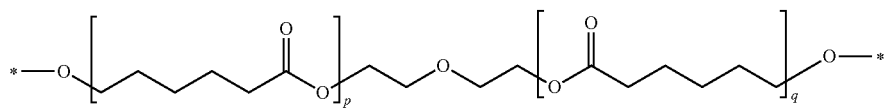
[Formula 2]

The p and q are integers selected in the range of 1 to 50.

The polyol may further include a repetition unit expressed in formula 3 in addition to repetition units expressed in formula 1 and formula 2.

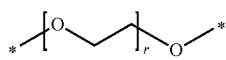
[Formula 3]

The r is an integer selected in the range of 0 to 30. The polyol includes the repetition unit expressed in formula 3 to adjust a molecular weight of the urethane acrylate oligomer and adjust compatibility and a mechanical property. If necessary, ethylene oxide may be added to the polyol so that the polyol includes the repetition unit expressed in formula 3.

The polyol includes one selected from the group consisting of polycarbonate polyol, polycaprolactone polyol and the combination thereof. The polyol may further include one selected from the group consisting of linear polyol, circular polyol, and the combination thereof.

The isocyante may include a circular or linear isocyanate having at least two functional groups.

The monomer having a double bond may include a monomer having a chain structure. In addition, the monomer may include a circular monomer. The monomer may be one type of monomer, or may be a monomer obtained by mixing at least two types of monomers.

The photoinitiator photocures the resin composition. The photoinitiator may be used by mixing one type of photoinitiator or two types of photoinitiators. When at least two types of photoinitiators are used, the photoinitiator is used by appropriately mixing short and long wavelength band initiators with each other. In this case, the wavelength band of the photoinitiator may be adjusted by the material of the substrate 100.

The curing accelerator performs the function of an attachment enhancer. The curing accelerator contributes to the enhancement of a cross-linking density, a curing rate, and a bonding strength to a substrate. The curing accelerator may employ a multifunctional acrylate having at least three functional groups.

The additives may include one selected from the group consisting of anti-foaming agents, wetting agents, dispersants, rheological additives, and the combination thereof.

The resin composition according to the present invention is less contracted in volume, has a high cross-linking density, and represents a bonding characteristic to various materials. Accordingly, even if the substrate includes an optically isotrophic film, such as COC, COP, optically isotrophic PC, and optically isotrophic PMMA, the substrate 100 may have a bonding property.

The pattern layer 280 including the resin composition may include the intaglio part 283 and the embossed part 284. The embossed part 283 may be formed through an imprinting process. In other words, the intaglio part 283 may be formed by coating the resin composition on the substrate 100, placing a mold on a resultant structure, and performing the imprinting process with respect to the resultant structure. The pattern layer 280 formed on the resin composition has a superior filling property for the mold pattern and has superior bonding strength to the substrate 100 when the intaglio part 283 and the embossed part 284 are formed through the imprinting process using the mold.

The electrode layer 270 may be provided in the intaglio part 283. In other words, the electrode layer 270 may be formed in the intaglio part 283 by filling the sensing electrode material into the intaglio part 283. Accordingly, the number of processes, the process time, and the process cost can be reduced as compared with conventional deposition and photolithography processes.

The embossed part 284 may be interposed between the intaglio part 283 and an adjacent intaglio part 283. The embossed part 284 may be formed together with the intaglio part 283 when the intaglio part 283 is formed. Although the drawings show a protrusion part having the embossed part 284, the embodiment is not limited thereto. The shape of the protrusion part may have various shapes according to occasions.

The conductive material constituting the electrode layer 270 may be filled in as a doctor knife is moved in contact with the pattern layer 280. The electrode layer 270 may include a binder and conductive particles dispersed into the binder.

The binder may be an organic binder. The binder has the content in the range of 5 weight % to 15 weight % based on the whole weight of the electrode layer 270. If the binder has the content of 5 weight % or more based on the whole weight of the electrode layer 270, the bonding strength of the electrode layer 270 may be improved. In addition, if the binder has the content of 15 weight % or less based on the whole weight of the electrode layer 270, the viscosity of the electrode material can be appropriately maintained in a printing process.

The conductive particles are dispersed in the binder. The conductive particles are uniformly dispersed in the binder, so that the uniformity of the electrode layer 270 can be improved. The conductive particles may include Cu, Au, Ag, Al, Ti, Ni and the alloy thereof.

The electrode layer 270 is provided in the mesh shape. The mesh shape may be randomly formed to prevent the moire phenomenon. In detail, the electrode part 200 includes the mesh opening part OA and the mesh line part LA. In this case, the intaglio part 283 is provided in the mesh line pat LA, and the embossed part 284 may be provided in the mesh opening part OA. The electrode part 200 and the mesh opening part OA may have various shapes.

Although the disclosure will be described in more detail based on the embodiments and the experimental results of the resin compositions, the embodiment of the disclosure may be modified in various shapes, and the scope of the disclosure is not limited to the embodiments to be described below.

Embodiment

After introducing 14 weight part of polyol having l=1, m=1, and n=1 in following formula 1, 31.5 weight part of polyol having p=1 and q=1 in following formula 6, and 23.5 weight part of methylene-bis (4-cyclohexyl isocyanate) into a flask having a nitrogen inlet, the temperature of the flask was increased to 70° C. and maintained for two hours.

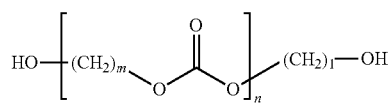

[Formula 5]

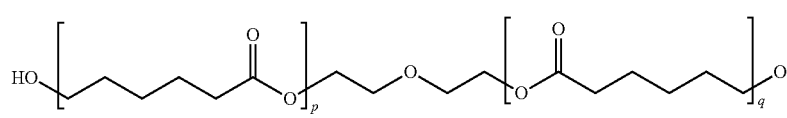

[Formula 6]

Thereafter, 16 weight part of methacrylate was added to the result in order to synthesize the urethane acrylate oligomer. After synthesizing the urethane acrylate oligomer, 29 weight part of isobornyl acrylate was added in order to adjust the viscosity of the solution including isobornyl acrylate to obtain a solution including urethane acrylate oligomer finally.

After adding 28 weight % (content of urethane acrylate oligomer in a solution including the urethane acrylate oligomer) of urethane acrylate oligomer, 60 weight % of dicyclopentanyl methacrylate as the monomer having a double bond, 5 weight % of Darocur 1173 (Ciba) as a photoinitiator, and 7 weight % of dendric acrylate expressed in formula 4 and serving as a curing accelerator, the result was stirred at a room temperature for a half an hour to obtain a photocurable resin composition.

[Formula 4]

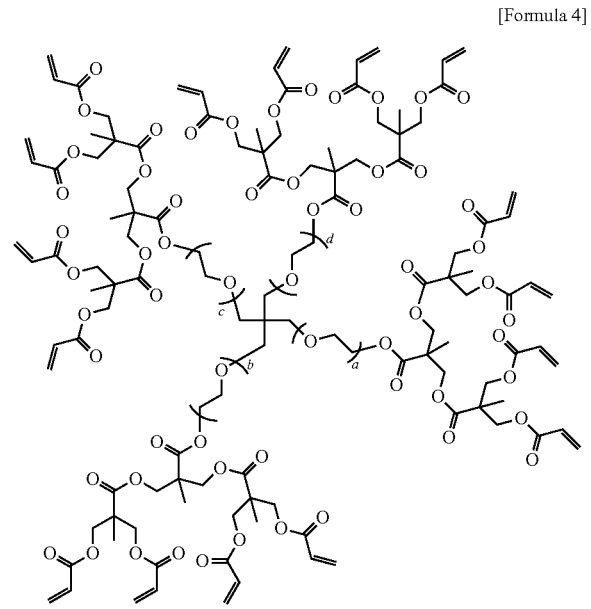

The a, b, c, d are integers selected in the range of 0 to 5 while satisfying a+b+c+d=5.

Comparative Example 1

In the comparative example 1, the photocurable resin composition was obtained in the same method as that of the embodiment except that 1,4-butanediol was used instead of the polyol of formulas 1 and 2, and 1,4-tetramethylene diisocyanate, which is isocyante having a linear structure, was used as isocynate contained in the urethane acrylate oligomer.

Comparative Example 2

In the comparative example 2, the photocurable resin composition was obtained in the same method as that of the embodiment except that 1,6-hexanediol diacrylate was used instead of dentric acrylate expressed in formula 4, and 1,4-tetramethylene diisocyanate, which is isocyante having a linear structure, was used as isocynate contained in the urethane acrylate oligomer.

Experimental Example—Bonding Strength Evaluation

The photocurable resin composition obtained according to the embodiment, and comparative examples 1 and 2 was coated and cured on the substrate including COP, COC, PC, and PMMA to obtain a curing layer of 20 μm.

After a pressure cooker test was performed through an ASTM D3359 scheme (120° C., 100% of humidity, four hours), film-delamination was performed using a 3M 610 tape. The delamination ratios of the experimental example, the comparative example 1 and the comparative example 2 were measured and shown in table 1.

TABLE 1

|  | COP | COC | PC | PMMA |
|---|---|---|---|---|
| Embodiment | 5B | 5B | 5B | 5B |
| Comparative example 1 | 0B | 3B | 0B | 2B |
| Comparative example 2 | 0B | 1B | 0B | 0B |

5B, 4B, 3B, 2B, and 1B refer to that the delamination ratios are 0%, 5%, 5-15%, 15-35%, 35-65%, and more than 65%, respectively.

From table 1, the cured film obtained from the photocurable resin composition according to the embodiment may have superior bonding strength to all of COP, COC, PC, and PMMA substrate.

However, from table 1, in the case of comparative example 1, bonding strength is represented to some extent on the COC and PMMA substrates. However, it can be recognized that the bonding strength is rarely formed on the COP and PC substrates. In addition, the COC substrate and the PMMA substrates represent bonding strength lower than that of the embodiment. Further, it can be recognized that the delamination ratio exceeds 35% on the COC substrate, and the bonding strength is rarely formed on the COP, PC, and PMMA substrates in the comparative example 2.

It can be recognized through the experimental example that the photocurable rein composition according to the disclosure not only represents stronger bonding strength, but also allows the formation of a pattern on various substrates. Accordingly, the bonding strength of the pattern layer according to the disclosure including the resin composition can be ensured even if the substrate is formed of a material difficult in bonding.

Hereinafter, an embodiment different from the above embodiments will be described with reference to FIGS. 9 to 18. In the following description, the details of the structures and the components the same as or similar to those according to prior embodiments will be omitted.

Referring to FIGS. 9 and 10, a touch window according to another embodiment may include a cover substrate 50 including a first region AA, a second region UA, and a third region IA, an electrode part 200, a wire 300, and a command icon.

The cover substrate 50 may include glass or plastic. For example, the cover substrate 50 may include tempered glass, semi-tempered glass, soda lime glass, or reinforced plastic.

However, the embodiment is not limited thereto. The cover substrate 50 may include various materials to support the electrode part 200, the wire 300, and the command icon.

The substrate 100 may be provided under the cover substrate 50. The electrode part 200 may be provided on the substrate 100. An optical clear adhesive 600 may be interposed between the cover substrate 50 and the substrate 100 so that the cover substrate 50 may be combined with the substrate 100.

The substrate 100 may include the above-described substrate. In detail, the retardation difference depending on the incident angle of light in the substrate 100 may be less than 0.2%. In detail, the retardation difference depending on the incident angle of light in the substrate 100 may be in the range of 0.001% to 0.2%. The retardation depending on the incident angle of light in the substrate 100 may be 5 or less. The substrate 100 has water absorption of 0.1% or less. In other words, the substrate 100 has water absorption exceeding 0% and equal to or less than 0.1%. The wavelength dispersion of the substrate 100 at 400 nm to 700 nm is in the range of 0.9 to 1.1. The substrate 100 may include an optically isotrophic film. Although the substrate 100 has been described in detail, the details thereof will be omitted.

Meanwhile, a printed circuit board 700 connected with the wire 300 may be further positioned in the touch window. The printed circuit board 700 may employ various types of printed circuit boards. For example, a flexible printed circuit board (FPCB) may be employed.

Referring to FIGS. 11 to 12, a first electrode part 210 may be formed on one surface of the cover substrate 50, and a second electrode part 220 may be formed on one surface of the substrate 100 provided on the cover substrate 50. An optical clear adhesive 600 may be interposed between the cover substrate 50 and the substrate 100.

The substrate 100 may include the above-described substrate. In detail, the retardation difference depending on the incident angle of light in the substrate 100 may be less than 0.2%. In detail, the retardation difference depending on the incident angle of light in the substrate 100 may be in the range of 0.001% to 0.2%. The retardation depending on the incident angle of light in the substrate 100 may be 5 or less. The substrate 100 has water absorption of 0.1% or less. In other words, the substrate 100 has water absorption exceeding 0% and equal to or less than 0.1%. The wavelength dispersion of the substrate 100 at 400 nm to 700 nm is in the range of 0.9 to 1.1. The substrate 100 may include an optically isotrophic film. Although the substrate 100 has been described in detail, the details thereof will be omitted.

The first electrode part 210 may be provided on the cover substrate 50, and the second electrode part 220 may be provided on the substrate 100.

Meanwhile, the printed circuit board 700 connected with the wire 300 may be further positioned in the touch window. The printed circuit board 700 may employ various types of printed circuit boards. For example, a flexible printed circuit board (FPCB) may be employed.

Meanwhile, referring to FIGS. 13 and 14, the first electrode part 210 may be formed on a first substrate 101 provided on the cover substrate 50, and the second electrode part 220 may be formed on a second substrate 102 provided on the first substrate 101. Optical transparent adhesives 610 and 620 may be provided among the cover substrate 50, the first substrate 101, and the second substrate 102. The first and second substrates 101 and 102 may include the above-described substrate according to the embodiment.

In detail, the retardation difference depending on the incident angle of light in the first and second substrate 101 and 102 may be less than 0.2%. In detail, the retardation difference depending on the incident angle of light in the first and second substrates 101 and 102 may be in the range of 0.001% to 0.2%. The retardation depending on the incident angle of light in the substrate 100 may be 5 or less. The first and second substrates 101 and 102 have water absorption of 0.1% or less. In other words, the first and second substrates 101 and 102 have water absorption exceeding 0% and equal to or less than 0.1%. The wavelength dispersion of the substrate 100 at 400 nm to 700 nm is in the range of 0.9 to 1.1. The first and second substrates 101 and 102 may include an optically isotrophic film. Although the first and second substrates 101 and 102 have been described in detail, the details thereof will be omitted.

Referring to FIGS. 15 and 16, an intermediate layer 400 may be provided on the substrate 100. The intermediate layer 400 may be provided on the second electrode part 220. The intermediate layer 400 may support the first electrode part 210. Simultaneously, the intermediate layer 400 may insulate the first electrode part 210 from the second electrode part 220.

The substrate 100 may include the above-described substrate. In detail, the retardation difference depending on the incident angle of light in the substrate 100 may be less than 0.2%. In detail, the retardation difference depending on the incident angle of light in the substrate 100 may be in the range of 0.001% to 0.2%. The retardation depending on the incident angle of light in the substrate 100 may be 5 or less. The substrate 100 has water absorption of 0.1% or less. In other words, the substrate 100 has water absorption exceeding 0% and equal to or less than 0.1%. The wavelength dispersion of the substrate 100 at 400 nm to 700 nm is in the range of 0.9 to 1.1. The substrate 100 may include an optically isotrophic film. Although the substrate 100 has been described in detail, the details thereof will be omitted.

The intermediate layer 400 may include materials different from a material constituting the substrate 100. For example, the intermediate layer 400 may include a dielectric material.

For example, the intermediate layer 400 may include insulator materials including alkaline earth metals, such as LiF, KCl, CaF2, or MgF2, halogen compounds of alkali earth metal, fused silico, $SiO_2$, or SiNX, semiconductor materials, such as InP or InSb, transparent oxides used in a semiconductor or a dielectric material, which include In compounds, such as ITO and IZO, mainly used in a transparent electrode including ITO or IZO, or transparent oxides, such as ZnOx, ZnS, ZnSe, TiOx, WOx, MoOx, and ReOx, used as a semiconductor or a dielectric, an organic semiconductor, such as Alq3, NPB, TAPC, 2TNATA, CBP, or Bphen, a low dielectric constant material, such as silsesquioxane or derivatives thereof (hydrogen-silsesquioxane (H—SiO3/2)n, methyl-silsesquioxane (CH3-SiO3/2)n), porous silica or a fluorine or carbon atom-doped porous silica, pours zinc oxide (ZnOx), a fluorinated polymer compound (CYTOP) or the compounds thereof. The intermediate layer 400 may have visible light transmittance in the range of 75% to 99%.

In this case, the thickness of the intermediate layer 400 may be thinner than the thickness of the protective substrate 100. The thickness T2 of the intermediate layer 400 may be thinner than the thickness T1 of the substrate 100. In detail, the thickness T2 of the intermediate layer 400 may be in the range of 0.05 to 0.5 times as thick as the thickness T1 of the substrate 100. For example, when the thickness T1 of the substrate 100 is 0.05 mm, the thickness T2 of the intermediate layer 400 may be 0.005 mm.

The intermediate layer 400 may be directly formed on the top surface of the substrate 100. In other words, a dielectric material is directly coated on the top surface of the substrate 100 to form the intermediate layer 400. Thereafter, the first electrode part 210 may be formed on the intermediate layer 400.

The touch window can ensure the thin thickness of the touch window through the intermediate layer 400 to improve the light transmittance and to prevent the cracks of the first and second electrode parts 210 and 220. Accordingly, the bending characteristic and the reliability of the touch window can be improved.

Meanwhile, referring to FIGS. 17 and 18, the first electrode part 210 may be formed on one surface of the substrate 100 provided on the cover substrate 50, and the second electrode part 220 may be formed on an opposite surface of the substrate 100. Accordingly, the touch window thickness can be reduced.

The substrate 100 may include the above-described substrate according to the embodiment. In detail, the retardation difference depending on the incident angle of light in the substrate 100 may be less than 0.2%. In detail, the retardation difference depending on the incident angle of light in the substrate 100 may be in the range of 0.001% to 0.2%. The retardation depending on the incident angle of light in the substrate 100 may be 5 or less. The substrate 100 has water absorption of 0.1% or less. In other words, the substrate 100 has water absorption exceeding 0% and equal to or less than 0.1%. The wavelength dispersion of the substrate 100 at 400 nm to 700 nm is in the range of 0.9 to 1.1. The substrate 100 may include an optically isotrophic film. Although the substrate 100 has been described in detail, the details thereof will be omitted.

Hereinafter, a touch device in which the touch window according to the embodiments described above is coupled to a display panel will be described with reference to FIGS. 19 and 20.

Referring to FIGS. 19 and 20, the touch device according to the embodiment may include a touch window integrally formed with the display panel 800. In other words, the substrate to support the electrode part may be omitted. In addition, the display panel 800 may further include the substrate according to the embodiment described above.

In detail, the electrode part 200 may be formed on at least one surface of the display panel 800. The display panel 800 includes a first panel substrate 801 and a second panel substrate 802. In other words, the electrode part 200 may be formed on at least one surface of the first panel substrate 801 or the second panel substrate 802.

When the display panel 800 is a liquid crystal display panel, the display panel 800 may be formed in a structure in which the first panel substrate 801 including a thin film transistor (TFT) and a pixel electrode is combined with the second panel substrate 802 including color filter layers while a liquid crystal layer is interposed between the first and second substrates 801 and 802.

In addition, the display panel 800 may be a liquid crystal display panel having a COT (color filter on transistor) structure in which a thin film transistor, a color filter, and a black matrix are formed on the first panel substrate 801, and the first panel substrate 801 is combined with the second panel substrate 802 while a liquid crystal layer is interposed between the first and second panel substrates 801 and 802. In other words, the thin film transistor may be formed on the first panel substrate 801, a protective layer may be formed on the thin film transistor, and the color filter layer may be formed on the protective layer. In addition, a pixel electrode making contact with the thin film transistor is formed on the first panel substrate 801. In this case, in order to improve the opening rate and simplify the mask process, the black matrix may be omitted, and the common electrode may perform the inherent function thereof and the function of the black matrix.

In addition, when the display panel 800 is a liquid crystal panel, the display device may further include a backlight unit for providing light from the rear surface of the display panel 800.

When the display panel 800 is an organic electroluminescent display panel, the display panel 800 includes a self light-emitting device which does not require any additional light source. The display panel 800 includes a thin film transistor formed on the first panel substrate 801 and an organic light emitting device (OLED) making contact with the thin film transistor. The OLED may include an anode, a cathode and an organic light emitting layer formed between the anode and the cathode. In addition, the second panel substrate 802 may be further formed on the organic light emitting device to perform the function of an encapsulation substrate for encapsulation.

In this case, at least one electrode part 200 may be formed on the top surface of an upper substrate. Although drawings show the structure in which the electrode part 200 is formed on the top surface of the second panel substrate 802, when the first panel substrate 801 may serve as the upper substrate, at least one electrode part 200 may be formed on the top surface of the first panel substrate 801. In addition, the electrode part 200 may include the electrode part according to the embodiment described above.

Referring to FIG. 19, the electrode part 200 may be formed on the top surface of the display panel 800. In addition, a wire connected with the electrode part 200 may be formed. An adhesive layer 600 may be provided on the display panel 800 having the electrode part 200 and a cover substrate may be provided thereon.

Referring to FIG. 20, the display panel includes the first and second panel substrates 801 and 802, and the electrode part 200 is interposed between the first and second panel substrate 801 and 802. In other words, the electrode part 200 may be formed on at least one surface of the first panel substrate 801 or the second panel substrate 802. Although the touch window formed integrally with the display panel has been described with reference to FIGS. 19 and 20, the embodiment is not limited thereto. In other words, the touch window according to the embodiments is provided on the display panel, and the touch window may be bonded to the display panel through the adhesive layer.

Hereinafter, one example of the touch device employing the touch window according to the embodiments will be described with reference to FIGS. 12 to 24.

Referring to FIG. 21, as one example of the touch device, a mobile terminal is shown. The mobile terminal 1000 may include the active region AA and the unactive region UA. The active region AA may be provided to detect a touch signal generated from the touch by a finger, and the unactive region UA may be provided therein with a command icon pattern part and a logo.

Referring to FIG. 22, the touch window may include a flexible touch window that may be bent. Accordingly, the touch device including the touch window may be a flexible touch device. Accordingly, a user can curve or bend the touch device with the hand of the user.

Referring to FIG. 23, the touch window may be applied to a vehicle navigation as well as a touch device such as the mobile terminal.

Referring to FIG. 24, the touch window may be applied into a vehicle. In other words, the touch window may be applied to various parts in the vehicle, which allow the application of the touch window. Accordingly, the touch window is applied to a dashboard as well as a PND (Personal Navigation Display), thereby realizing a CID (Center Information Display). However, the embodiment is not limited to the embodiment. In other words, the display may be used in various electronic products.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

INDUSTRIAL APPLICABILITY

The embodiment provides a touch window having improved reliability and a display including the same.

The invention claimed is:

1. A touch window comprising:
a substrate; and
an electrode part provided on the substrate and including an electrode layer and a pattern layer having a plurality of first sub-patterns and a plurality of second sub-patterns, wherein the electrode layer is provided only on the plurality of first sub-patterns, wherein the plurality of second sub-patterns are provided between the plurality of first sub-patterns, wherein a width of each first sub-pattern of the plurality of first sub-patterns is larger than a width of each second sub-pattern of the plurality of second sub patterns, wherein a retardation difference is 0.2% or less depending on an incident angle of light in the substrate, wherein the pattern layer comprises a photocurable resin composition comprising (a) urethane acrylate oligomer comprising one selected from the group consisting of polycarbonate polyol, polycaprolactone polyol, and combination thereof, (b) a monomer having a double bond, (c) a photoinitiator, and (d) a curing accelerator, and wherein the monomer having the double bond includes one selected from the group consisting of 1,4-butanediol dimethacrylate, dimethylaminoethyl methacrylate, 2-ethylhexyl methacrylate, iso-decyl methacrylate, glycidyl methacrylate, n-butyl methacrylate, hexyl methacrylate, decyl methacrylate, 1,6-hexanediol dimethacrylate, ethoxylated bisphenol-A dimethacrylate, t-butylaminoethyl methacrylate, isoamyl methacrylate, isobutyl methacrylate, diethylene glycol dimethacrylate, triethylene glycol dimethacrylate, 1,3-butanediol dimethacrylate, and combination thereof.

2. The touch window of claim 1, wherein a retardation exceeds 0 nm and is equal to or less than 5 nm depending on the incident angle of the light in the substrate.

3. The touch window of claim 1, wherein the substrate has water absorption of 0.1% or less.

4. The touch window of claim 1, wherein wavelength dispersion of the substrate at 400 nm to 700 nm is in a range of 0.9 to 1.1.

5. The touch window of claim 1, wherein the substrate comprises an optically isotropic film.

6. The touch window of claim 1, wherein the substrate comprises one selected from the group consisting of cyclic olefin copolymer (COC), cyclic olefin polymer (COP), optically isotropic polycarbonate (PC), and optically isotropic polymethyl methacrylate (PMMA).

7. The touch window of claim 1, the pattern layer is disposed between the substrate and the electrode layer.

8. The touch window of claim 7, wherein (a) the urethane acrylate oligomer comprises at least one of repetition units expressed in formula 1 and formula 2,

[Formula 1]

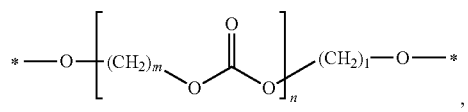

in which the l, m, and n are integers selected in a range of 1 to 30, respectively,

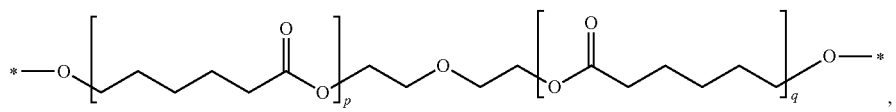

[Formula 2]

in which the p and the q are integers selected in a range of 1 to 50, respectively.

9. The touch window of claim 7, wherein (a) the urethane acrylate oligomer further comprises one selected from the group consisting of linear polyol, circular polyol, and combination thereof.

10. The touch window of claim 7, wherein (a) the urethane acrylate oligomer further comprises circular or linear isocyanate having at least two functional groups.

11. The touch window of claim 7, wherein (c) the photoinitiator comprises one selected from the group consisting of 2-hydroxy-2-methyl-1-phenylpropan-1-one, 2,2-dimethoxy-1,2-diphenylethan-1-one, 1-hydroxycyclohexylphenylketone, 2-methyl-1-[4-(methylthio)phenyl]-2-(4-morpholinylpropan-1-one), bis(2,4,6-trimethylbenzoyl)-phenylphosphine oxide, 2,4,6-trimethylbenzoyldiphenylphosphine oxide, and combination thereof.

12. The touch window of claim 7, wherein (d) the curing accelerator comprises one selected from the group consisting of trimethylolpropane triacrylate, glycerine propoxylated triacrylate, pentaerythritol triacrylate, dimethylolpropane tetraacrylate, pentaerythritol tetraacrylate, dipentaerythritol pentaacrylate, dipentaerythritol hexa(m-eth)acrylate, dendritic acrylate expressed in formula 4, and composition thereof,

[Formula 4]

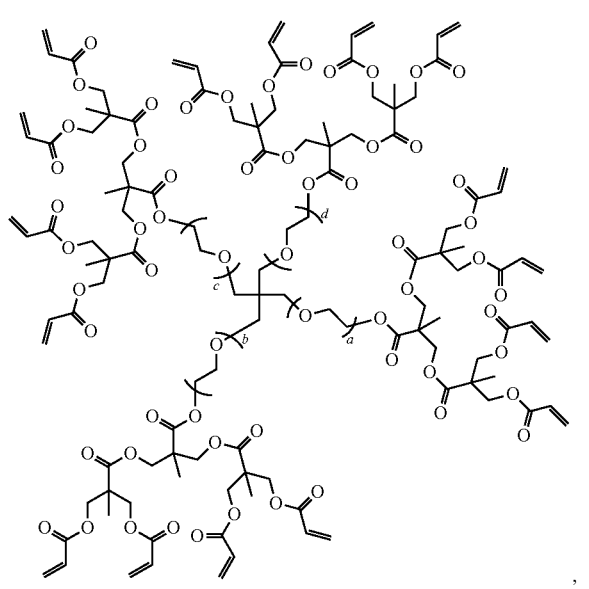

in which the a, b, c, and d are integers selected in the range of 0 to 5 while satisfying a+b+c+d=5.

13. The touch window of claim 7, wherein the resin composition constituting the pattern layer further comprises an additive comprising one selected from the group consisting of (e) an anti-foaming agent, a wetting agent, a dispersant, a rheological additive, and combination thereof.

14. The touch window of claim 7, wherein the resin composition constituting the pattern layer comprises (a) 10 weight % to 65 weight % of the urethane acrylate oligomer, (b) 20 weight % to 90 weight % of the monomer having the double bond, (c) 0.1 weight % to 10 weight % of the photoinitiator, (d) 3 weight % to 10 weight % of the curing accelerator, and (e) 0.5 weight % to 10 weight % of an additive.

15. The touch window of claim 1,
wherein the second sub-pattern is adjacent to the first sub-pattern, and
wherein the electrode layer is provided on the first sub-pattern, and a ratio of a width of the first sub-pattern to a width of the second sub-pattern is in a range of 1:0.03 to 1:0.05.

16. The touch window of claim 15, wherein the ratio of the width of the first sub-pattern to a height of the first sub-pattern is in a range of 1:0.1 to 1:1.

17. The touch window of claim 1,
wherein the electrode layer is disposed in a mesh shape.

18. The touch window of claim 1,
wherein the electrode layer includes Cu, Au, Ag, Al, Ti, Ni and an alloy thereof.

* * * * *